United States Patent
Villano et al.

(10) Patent No.: US 10,962,422 B2
(45) Date of Patent: Mar. 30, 2021

(54) DIFFERENTIAL AND HIGH RATE OF CHANGE TEMPERATURE SENSING CIRCUIT

(71) Applicant: Hamilton Sundstrand Corporation, Charlotte, NC (US)

(72) Inventors: William E. Villano, Canton, CT (US); Dean Anthony Rametta, Glastonbury, CT (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 286 days.

(21) Appl. No.: 16/121,823

(22) Filed: Sep. 5, 2018

(65) Prior Publication Data
US 2020/0072678 A1 Mar. 5, 2020

(51) Int. Cl.
G01K 1/14 (2006.01)
G01K 7/02 (2021.01)
H05K 1/18 (2006.01)
H03F 3/45 (2006.01)

(52) U.S. Cl.
CPC ............ *G01K 7/021* (2013.01); *H05K 1/18* (2013.01); *F05D 2220/323* (2013.01); *F05D 2260/80* (2013.01); *F05D 2270/54* (2013.01); *H03F 3/45475* (2013.01); *H05K 2201/09236* (2013.01); *H05K 2201/10151* (2013.01); *H05K 2201/2009* (2013.01)

(58) Field of Classification Search
CPC ............ G01K 7/02; G01K 7/021; G01K 7/06; G01K 1/14; G01K 1/143; G01K 1/16; G01K 3/005

USPC ... 374/178, 45, 137, 110, 111, 112, 115, 29, 374/30, 114, 183, 166, 141, 180, 152; 361/752, 748
See application file for complete search history.

(56) References Cited

U.S. PATENT DOCUMENTS

| 5,607,538 | A | * | 3/1997 | Cooke ............... H05K 1/0206 156/291 |
| 6,039,471 | A | * | 3/2000 | Wyland .................. G01K 7/01 374/43 |
| 6,472,612 | B2 | | 10/2002 | Fartash et al. |
| 7,698,023 | B2 | | 4/2010 | Barry et al. |

(Continued)

FOREIGN PATENT DOCUMENTS

| KR | 100671485 A | 1/2007 | |
| WO | WO-2009096966 A1 * | 8/2009 | ............... G01K 1/20 |

OTHER PUBLICATIONS

European Search Report for Application No. 19194144.2, dated Jan. 21, 2020.

*Primary Examiner* — Gail Kaplan Verbitsky
(74) *Attorney, Agent, or Firm* — Cantor Colburn LLP

(57) ABSTRACT

A system for determining a side of an electrical circuit exposed to a high temperature includes a printed circuit board having at least two outer edges and first and second board stiffeners of a first material disposed along the outer edges. The system also includes a control unit and a plurality of traces formed of a material that is different than the first material and has a second Seebeck coefficient. The control unit determines whether the first edge or second edge is closer to the high temperature based on a voltage differential between a trace connecting it to the first end of the first board stiffener and a trace connecting to the first end of the second board stiffener.

13 Claims, 4 Drawing Sheets

(56) References Cited

U.S. PATENT DOCUMENTS

| | | | |
|---|---|---|---|
| 8,159,356 B2 | 4/2012 | Farrell | |
| 8,602,643 B2 | 12/2013 | Gardiner | |
| 9,433,074 B2 | 8/2016 | Dede et al. | |
| 9,661,745 B1 * | 5/2017 | Yazzie | H05K 1/0271 |
| 10,048,729 B2 * | 8/2018 | Kinstle | H05K 7/20154 |
| 10,355,192 B2 * | 7/2019 | Rozgic | A61N 1/372 |
| 2001/0023591 A1 * | 9/2001 | Maeda | G06F 1/263 |
| | | | 62/3.2 |
| 2004/0174674 A1 | 9/2004 | Stewart | |
| 2006/0248358 A1 * | 11/2006 | Fung | G06F 1/3209 |
| | | | 713/300 |
| 2009/0144568 A1 * | 6/2009 | Fung | G06F 1/3287 |
| | | | 713/300 |
| 2009/0211603 A1 * | 8/2009 | Winter | B08B 7/04 |
| | | | 134/18 |
| 2014/0326715 A1 | 11/2014 | Zizzo | |
| 2018/0123014 A1 | 5/2018 | Zoller et al. | |
| 2020/0077892 A1 * | 3/2020 | Tran | A61B 5/6824 |

\* cited by examiner

DIFFERENTIAL AND HIGH RATE OF CHANGE TEMPERATURE SENSING CIRCUIT

BACKGROUND

Exemplary embodiments pertain to the art of electronic circuits and, in particular, to determining that an electronic circuit is exposed to a high temperature and a side of the circuit being exposed to that high temperature.

Thermal management of aircraft mounted electronic components is becoming increasingly more challenging with the higher density of more powerful, but smaller electronic components. Currently, embedded heat sinks have been used to move heat from a hot electronic component on a printed wiring board to cooler locations.

When a sudden source of intense heat is applied to an electronic component, such as a full authority digital engine control (FADEC) system, circuits in the component closest to the heat source can be exposed to temperatures that are outside of the specified operating range of the circuits. In such a case, it is very likely that more thermally isolated sections of the controller will be operating at normal temperatures.

As circuit operation may vary depending on temperature, one challenge presented to an electronics designer is to detect changes in temperature which may have a functional impact local to the heat source at one location on a circuit board in the controller but not affect circuits on another part of a circuit board.

In the context of aircraft, the sources of such heat can be from, for example, a fire or a burst duct.

BRIEF DESCRIPTION

Disclosed in embodiment is a system for determining a side of an electrical circuit exposed to a high temperature. The system of this embodiment includes a printed circuit board having at least two outer edges, a first board stiffener disposed along a first of the two outer edges, the first board stiffener having a first end and a second end and a second board stiffener disposed along a second of the two outer edges, the second board stiffener having a first end and a second end, wherein the first and second board stiffeners are formed of a first material having a first Seebeck coefficient. The system also includes a control unit and a plurality of traces formed of a second material that is different than the first material and has a second Seebeck coefficient. The traces connect the first end of the first and second board stiffeners to the control unit and connect the second end of the first and second board stiffeners to one another. The control unit determines whether the first edge or second edge is closer to the high temperature based on a voltage differential between a trace connecting it to the first end of the first board stiffener and a trace connecting to the first end of the second board stiffener.

In one embodiment, in a system of any prior embodiment, the traces are formed of copper.

In one embodiment, in a system of any prior embodiment, the first and second traces are formed of a material that is not copper.

In one embodiment, in a system of any prior embodiment, the control unit includes a differential amplifier.

In one embodiment, in a system of any prior embodiment, the traces are connected to the differential amplifier.

In one embodiment, in a system of any prior embodiment, the differential amplifier produces a positive pulse when the high temperature is closer to the first outer edge and negative pulse when the high temperature is closer to the second outer edge.

In one embodiment, in a system of any prior embodiment, the voltage differential (Vout) is equal defined as:

$$Vout = S_{traces} * [(T1+T4)-(T2+T3)] - S_{stiffeners} * [(T1+T4)-(T2+T3)]$$

where $S_{traces}$ is the Seebeck coefficient of the traces and where $S_{stiffener}$ is the Seebeck coefficient of the stiffeners, T1 is the temperature at the first end of the second stiffener, T2 is the temperature at the second end of the second stiffener, T3 is the temperature at the first end of the first stiffener, and T4 is the temperature at the second end of the first stiffener.

In another embodiment, an electronics chassis that includes a printed circuit board having at least two outer edges, a first board stiffener disposed along a first of the two outer edges, the first board stiffener having a first end and a second end and a second board stiffener disposed along a second of the two outer edges, the second board stiffener having a first end and a second end, wherein the first and second board stiffeners are formed of a first material having a first Seebeck coefficient is disclosed. The chassis also includes a control unit and a plurality of traces formed of a second material that is different than the first material and has a second Seebeck coefficient, the traces connecting the first end of the first and second board stiffeners to the control unit and connecting the second end of the first and second board stiffeners to one another. The control unit determines whether the first edge or second edge is closer a high temperature source external to the chassis based on a voltage differential between a trace connecting it to the first end of the first board stiffener and a trace connecting to the first end of the second board stiffener.

In one embodiment, in a chassis of any prior embodiment, the traces are formed of copper.

In one embodiment, in a chassis of any prior embodiment, the first and second traces are formed of a material that is not copper.

In one embodiment, in a chassis of any prior embodiment, the control unit includes a differential amplifier.

In one embodiment, in a chassis of any prior embodiment, the traces are connected to the differential amplifier.

In one embodiment, in a chassis of any prior embodiment, the differential amplifier produces a positive pulse when the high temperature is closer to the first outer edge and negative pulse when the high temperature is closer to the second outer edge.

In one embodiment, in a chassis of any prior embodiment, the housing is formed of the same material as the printed circuit board.

In one embodiment, in a chassis of any prior embodiment, the voltage differential (Vout) is equal defined as:

$$Vout = S_{traces} * [(T1+T4)-(T2+T3)] - S_{stiffeners} * [(T1+T4)-(T2+T3)]$$

where $S_{traces}$ is the Seebeck coefficient of the traces and where $S_{stiffeners}$ is the Seebeck coefficient of the stiffeners, T1 is the temperature at the first end of the second stiffener, T2 is the temperature at the second end of the second stiffener, T3 is the temperature at the first end of the first stiffener, and T4 is the temperature at the second end of the first stiffener.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Figure 1:
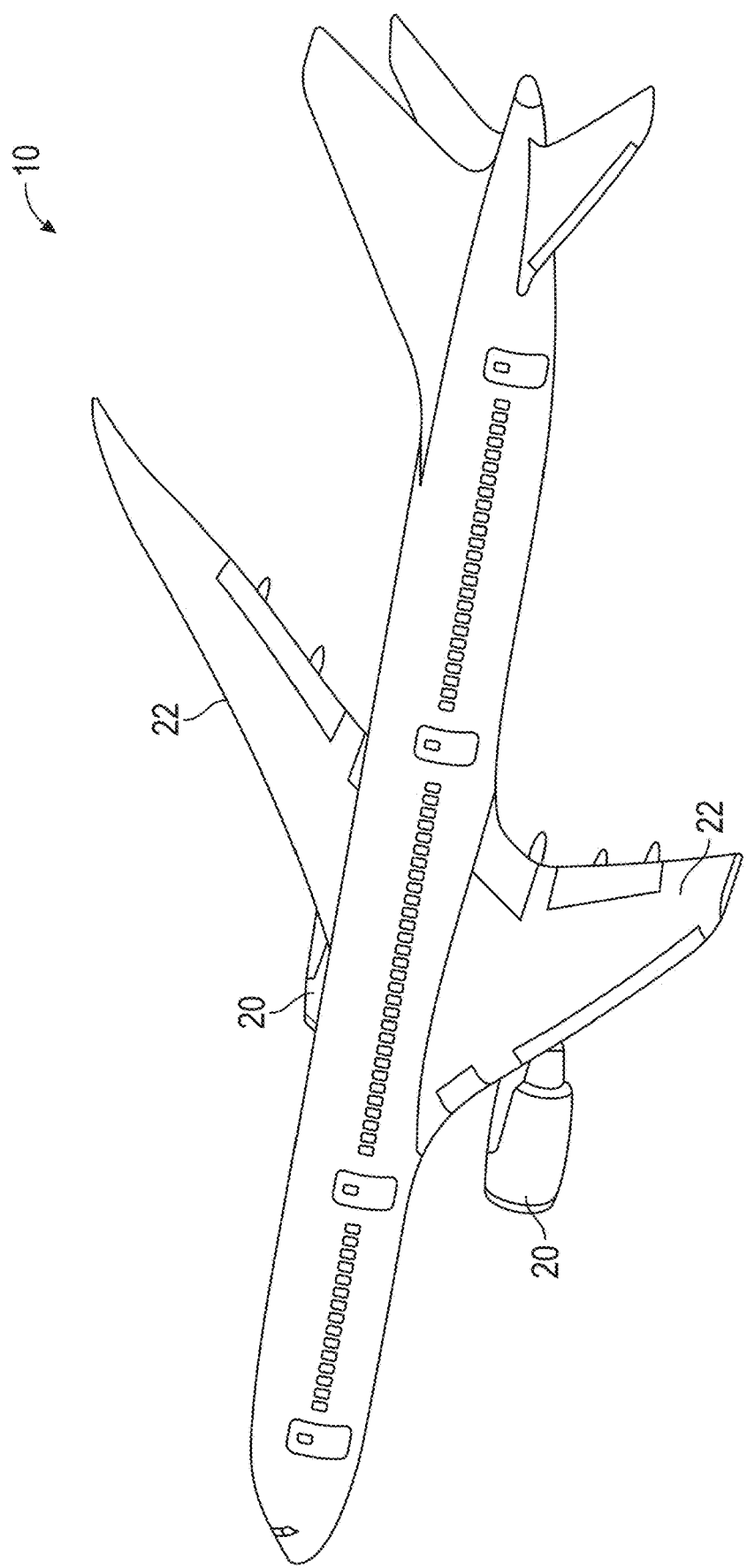
FIG. 1 is an aircraft in which embodiments of the present invention may be implemented.

For reference, in one embodiment, the circuit board temperature sensor of one embodiment can be included in an aircraft. FIG. 1 illustrates an example of a commercial aircraft 10 having aircraft engines 20 that may embody aspects of the teachings of this disclosure. The aircraft 10 includes two wings 22.

The teachings herein can be applied to any circuit board or controller contained in the aircraft. In one embodiment, the controller is a FADEC system. Such a system can be located in a high-temperature environment such as a jet engine, wherein there is a greater amount of heat generated outside the housing of the controller than inside. With respect to jet engines, insulation and the use of conventional cooling techniques are typically constrained by specification. Thus, in order to maintain an adequate operating temperature for the electrical components, it is often necessary to determine if circuits on one side of a printed circuit board (PCB) in the controller are experiencing greater heat than those on another side. While not limiting, to illustrate one environment where the teachings herein can be applied, the PCB can be located in a region in or near and aircraft jet engine 20 as illustrated in FIG. 2.

Figure 2:
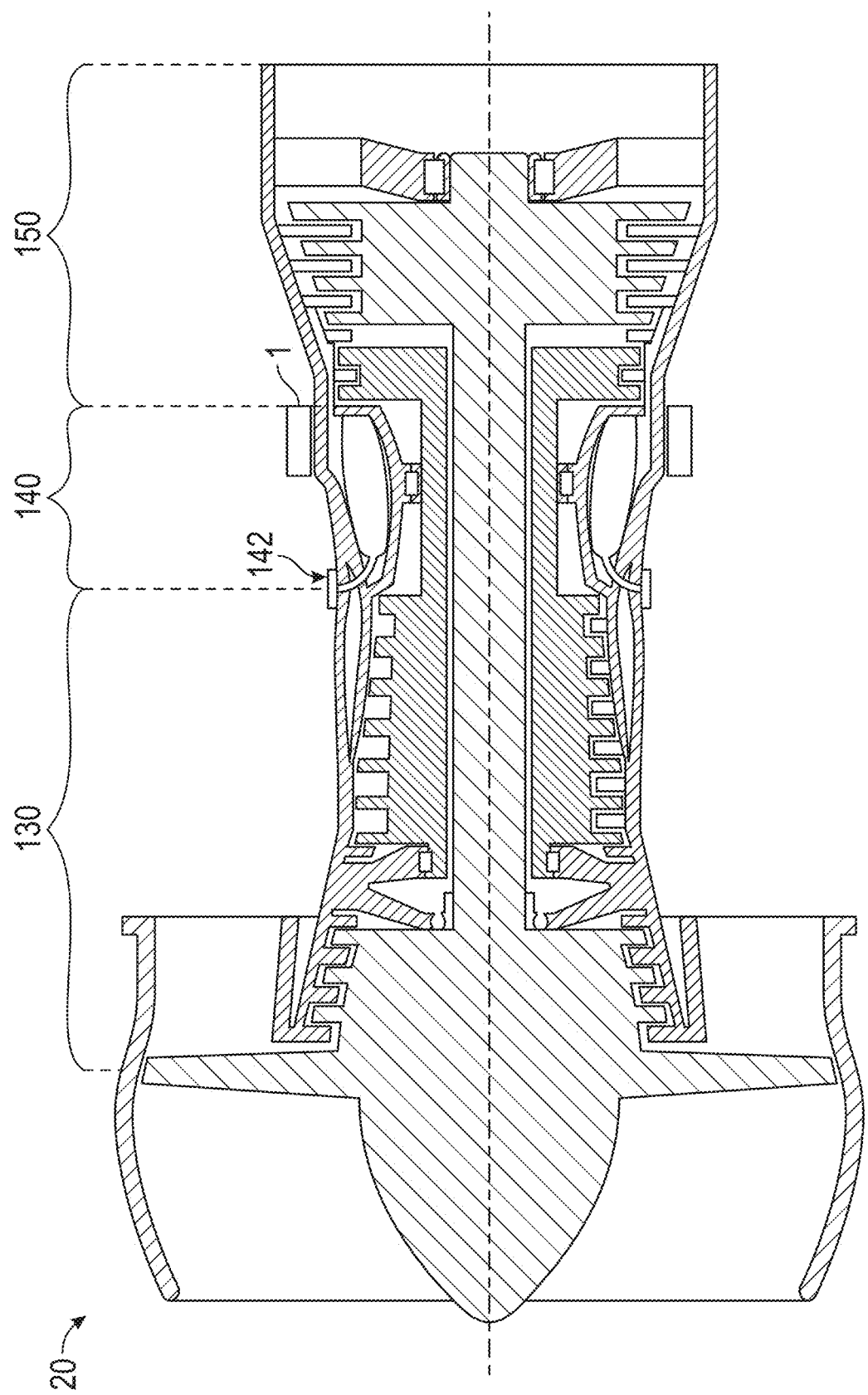
FIG. 2 is a turbine engine in which embodiments of the present invention may be implemented.

In FIG. 2, a PCB can be contained in an electrical chassis 1. FIG. 2 illustrates the electrical chassis 1 as part of an aircraft jet engine 100. In the illustrated embodiment, the different sections of the engine are illustrated, including a compression section 130, a combustion section 140, and an expansion section 150. The temperatures of the engine are most extreme in the combustion section 140 and the expansion section 150. In this example, the electrical chassis 1 is located adjacent to the combustion section 140. This location allows the electrical system for the engine 100 to be assembled with minimal cabling and wire harnesses. For example, the location of the electrical chassis 1 as shown is proximal to devices that may require control, such as fuel injector 142. Other locations may be more or less appropriate for a given configuration.

Figure 3:
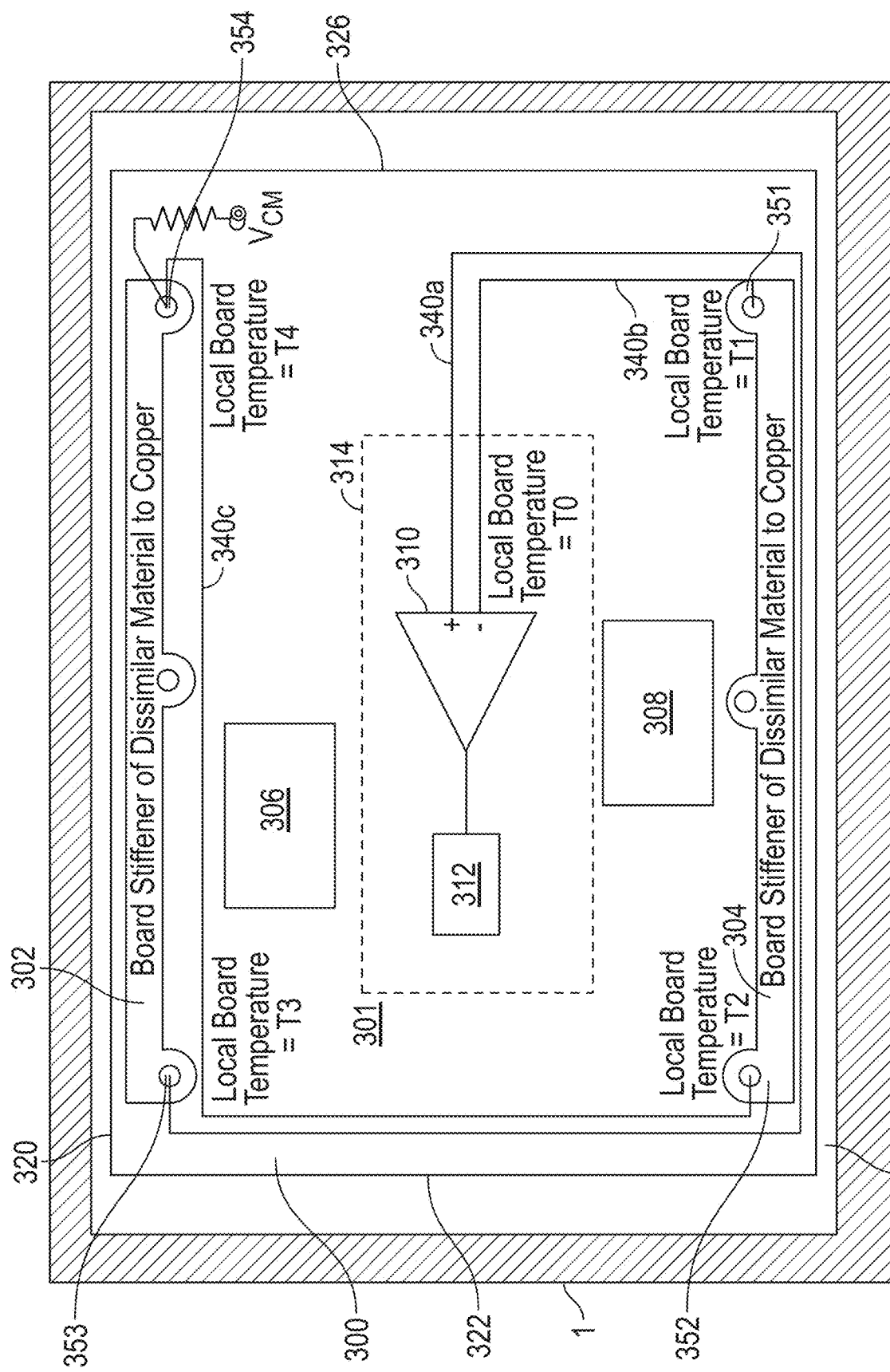
FIG. 3 is printed circuit board disposed in a chassis according to one embodiment.

FIG. 3 shows a PCB 300 located within a chassis 1. The PCB includes a substrate 301 on which one or more circuits 306, 308 are disposed. The circuits 306, 308 can be for example, processors, memory devices, transmitters, etc. While two circuits 306, 308 are shown, the skilled artisan will realize that this is but one example and any number of circuits can be located on the PCB 300, The PCB 300 can be formed of typical materials in one embodiment. Such materials can include a non-conductive substrate such as a laminate formed of by curing under pressure and temperature layers of cloth or paper with thermoset resin to form an integral final piece of uniform thickness. There can be one or more laminate layers and circuits (e.g., 306, 308) can be electrically connected by copper conductive tracks formed on the laminate or between layers of laminate.

In one embodiment, the substrate can be formed such they have high thermal conductivity by using materials such as beryllium oxide or various forms of silica, in order to conduct the heat generated by the electrical circuits 306, 308 away from the system.

The chassis 1 may be comprised of a lightweight, high strength material, such as a carbon composite. In other examples, the chassis 1 and the PCB 300 may be formed as a unitary structure from the same substance.

As shown, the PCB 300 includes four outer edges, 320, 322, 324, 326. The first edge 320 is opposite the third edge 324 and the second edge 322 is opposite the fourth edge 326.

First and second board stiffeners 302, 304 are disposed along the first and third edges 320, 324. The board stiffeners 302, 304 provide structural rigidity for the PCB 300. The board stiffeners 302, 304 can be formed of a material that has a first Seebeck coefficient. In one embodiment, the board stiffeners 302, 304 are formed of a conductive material that is not copper. For example, the board stiffeners 302, 304 can be formed of aluminum or steel.

The board stiffeners 302, 304 are connected to one another by metal traces generally referred to as traces 340 in FIG. 3. In particular, three traces 340a, 340b and 340c are illustrated. The number of traces in not as limiting and are shown by way of example. The traces 340 can be formed of a material that is different than the first material of the board stiffeners and, as such, have a second Seebeck coefficient that is different than the first Seebeck coefficient. In one embodiment, the traces 340 are formed of copper. As shown the traces 340 are all on top of the substrate 301. Of course, the traces 340 could be partially or wholly on the bottom of the substrate 301 or between layers of the substrate 301.

As shown, the traces 340 contact the board stiffeners 302, 304 at junctions 351, 352, 353 and 354. When one of the stiffener junctions 351, 352, 353 and 354 is exposed to a quick change in temperature, there is a thermal gradient across the stiffener for a short period of time. During this time period, a thermoelectric voltage is created across due to the dissimilar materials of the board stiffeners 302, 304 and the traces 340 that can be sensed with electrical instrumentation. This can be used to detect fire or burst duct conditions impinging on the areas near the stiffener terminations. As shown in FIG. 3, the temperatures at junctions 351, 352, 353 and 354 are T1, T2, T3 and T4, respectively. Herein, junction 351 is a first end of the second board stiffener 304, junction 352 is a second end of the second board stiffener 304, junction 353 is a first end of the first board stiffener 302, and junction 354 is a second end of the first board stiffener 302.

The traces 340a/340b are connected to the inputs of a differential amplifier 310. When the difference between the voltages on the traces 340a/340b exceeds a threshold, it can be determined if one of the edges is at a higher heat than another edge. If the voltage at the inverting input of the differential amplifier 310 (e.g., the voltage on trace 340b) is greater than the voltage at the non-inverting input of the differential amplifier 310, then the output of the differential amplifier 310 will be negative. If the voltage at the inverting input of the differential amplifier 310 (e.g., the voltage on trace 340b) is less than the voltage at the non-inverting input of the differential amplifier 310, then the output of the differential amplifier 310 will be positive. A controller 312 can determine a side of the circuit board exposed to a high temperature based on the output of the differential amplifier 310 in line with the above description. Herein, a combination of the differential amplifier and the controller 312 is referred to as a control unit 314.

In addition, the stiffeners 302, 304 can be connected to a common mode voltage (Vcm). The voltage, as illustrated, is connected to at junctions T2/T3. Application of Vcm to the inverting and non-inverting inputs of the differential amplifier 310 through stiffeners 302/304 as illustrated can be used to test the continuity of the connections.

Figure 4:
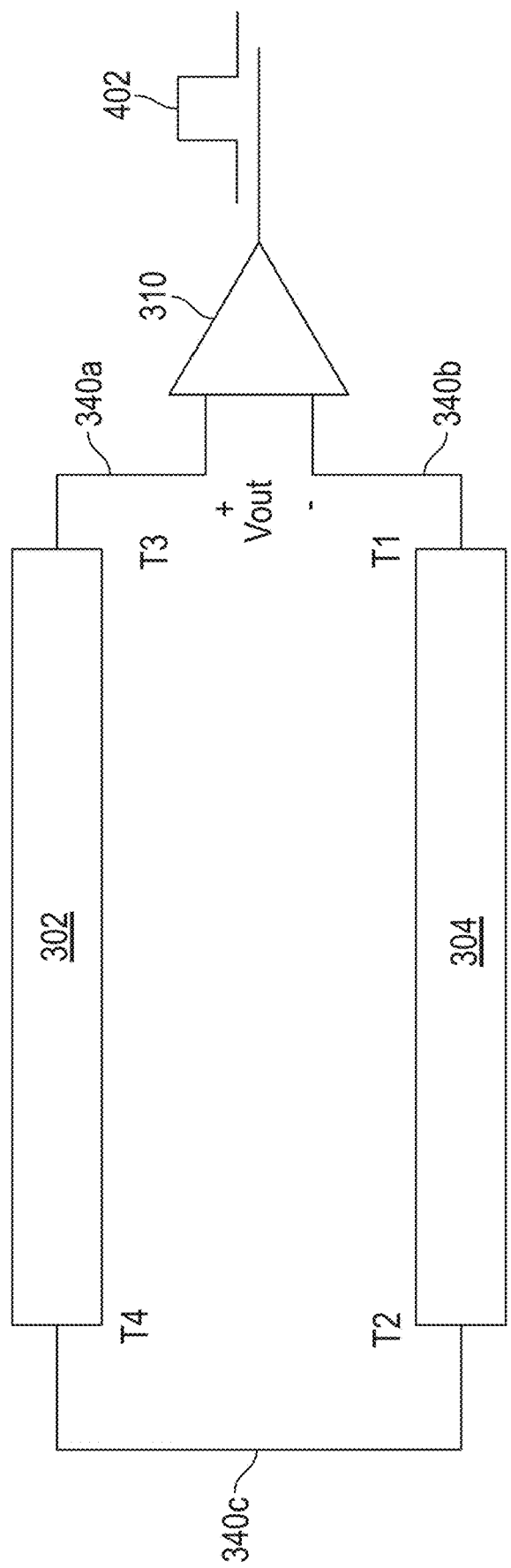
FIG. 4 is an equivalent circuit to that on the printed circuit board of FIG. 4.

For simplicity, FIG. 4 shows an equivalent circuit of the connections of the traces 340a-340c and the stiffeners 302, 304. The output of the circuit (Vout) that is provided to the differential amplifier 310 can be expressed as:

$$Vout = S_{traces} * [(T1+T4)-(T2+T3)] - S_{stiffeners} * [(T1+T4)-(T2+T3)]$$

where $S_{traces}$ is the Seebeck coefficient of the traces and where $S_{stiffeners}$ is the Seebeck coefficient of the stiffeners. In the above, $S_{stiffener}$ is the first Seebeck coefficient and $S_{traces}$ is the second Seebeck coefficient.

Vout will only be different for a short time period due to decay of thermal gradient over time. Thus, the output of the differential amplifier 310 will typically only produce pulse such as shown by waveform 402.

In one embodiment, the differential amplifier 310 produces a positive pulse when the high temperature is closer to the second end (junction 354) of the first board stiffener 302 or the first end (junction 351) of the second board stiffener 304 and a negative pulse when the high temperature is closer to the second end (junction 352) of second board stiffener 304 or the first end (junction 353) of the first board stiffener 302.

Given that the PCB is in chassis 1, the skilled artisan will realize that the teachings herein can be applied to a housing that includes a PCB and that includes elements that allow for determining side of the chassis that is closer to a high temperature source external to it based on a voltage differential produced as described above as along as the orientation of the PCB in the chassis is known.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A system for determining an edge of an electrical circuit exposed to a high temperature, the system including:
    a printed circuit board having at least two outer edges;
    a first board stiffener disposed along a first of the two outer edges, the first board stiffener having a first end and a second end;
    a second board stiffener disposed along a second of the two outer edges, the second board stiffener having a first end and a second end, wherein the first and second board stiffeners are formed of a first material having a first Seebeck coefficient;
    a control unit;
    a plurality of traces formed of a second material that is different than the first material and has a second Seebeck coefficient, the traces connecting the first end of the first and second board stiffeners to the control unit and connecting the second end of the first and second board stiffeners to one another;
    wherein the control unit determines whether the first edge or second edge is closer the high temperature based on a voltage differential between a trace connecting it to the first end of the first board stiffener and a trace connecting to the first end of the second board stiffener.

2. The system of claim 1, wherein the traces are formed of copper.

3. The system of claim 1, wherein the first and second traces are formed of a material that is not copper.

4. The system of claim 1, wherein the control unit includes a differential amplifier.

5. The system of claim 1, wherein the traces are connected to the differential amplifier.

6. The system of claim 5, wherein the differential amplifier produces a positive pulse when the high temperature is closer to the second end of the first board stiffener or the first end of the second board stiffener and a negative pulse when the high temperature is closer to the second end of second board stiffener or the first end of the first board stiffener.

7. An electronics chassis comprising:
    a printed circuit board having at least two outer edges;
    a first board stiffener disposed along a first of the two outer edges, the first board stiffener having a first end and a second end;
    a second board stiffener disposed along a second of the two outer edges, the second board stiffener having a first end and a second end, wherein the first and second board stiffeners are formed of a first material having a first Seebeck coefficient;
    a control unit;
    a plurality of traces formed of a second material that is different than the first material and has a second Seebeck coefficient, the traces connecting the first end of the first and second board stiffeners to the control unit and connecting the second end of the first and second board stiffeners to one another;
    wherein the control unit determines whether the first edge or second edge is closer a high temperature source external to the chassis based on a voltage differential between a trace connecting it to the first end of the first board stiffener and a trace connecting to the first end of the second board stiffener.

8. The chassis of claim 7, wherein the traces are formed of copper.

9. The chassis of claim 7, wherein the first and second traces are formed of a material that is not copper.

10. The chassis of claim 7, wherein the control unit includes a differential amplifier.

11. The chassis of claim 7, wherein the traces are connected to the differential amplifier.

12. The chassis of claim 11, wherein the differential amplifier produces a positive pulse when the high temperature is closer to the second end of the first board stiffener or the first end of the second board stiffener and a negative pulse when the high temperature is closer to the second end of second board stiffener or the first end of the first board stiffener.

13. The chassis of claim 7, wherein housing is the formed of a different material than the printed circuit board.

\* \* \* \* \*